(12) United States Patent
Suzuki et al.

(10) Patent No.: US 10,658,301 B2
(45) Date of Patent: May 19, 2020

(54) IMAGE PICKUP APPARATUS AND CAMERA MODULE

(71) Applicant: SONY CORPORATION, Tokyo (JP)

(72) Inventors: Masami Suzuki, Kanagawa (JP); Yoshihito Higashitsutsumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 203 days.

(21) Appl. No.: 15/645,572

(22) Filed: Jul. 10, 2017

(65) Prior Publication Data

US 2017/0373018 A1    Dec. 28, 2017

Related U.S. Application Data

(63) Continuation of application No. 15/138,887, filed on Apr. 26, 2016, now Pat. No. 9,735,115, which is a continuation of application No. 13/566,401, filed on Aug. 3, 2012, now Pat. No. 9,343,597.

(30) Foreign Application Priority Data

Aug. 11, 2011 (JP) .................................. 2011-176125

(51) Int. Cl.
*H04N 5/225* (2006.01)
*H01L 23/552* (2006.01)
*H01L 27/146* (2006.01)
*H01L 31/0232* (2014.01)
*H04N 5/369* (2011.01)

(52) U.S. Cl.
CPC ...... *H01L 23/552* (2013.01); *H01L 27/14618* (2013.01); *H01L 27/14636* (2013.01); *H01L 31/02325* (2013.01); *H04N 5/2254* (2013.01); *H04N 5/2257* (2013.01); *H04N 5/369* (2013.01); *H01L 2224/13* (2013.01)

(58) Field of Classification Search
CPC ..................................................... H01L 23/552
USPC ........................................................ 348/340
See application file for complete search history.

(56) References Cited

U.S. PATENT DOCUMENTS

2008/0116537 A1* 5/2008 Adkisson .......... H01L 27/14618
257/448
2010/0190338 A1* 7/2010 Koike ............... H01L 21/76898
438/667
2010/0244169 A1* 9/2010 Maeda .................. G02B 1/118
257/432

(Continued)

*Primary Examiner* — Stephen P Coleman
(74) *Attorney, Agent, or Firm* — Sheridan Ross P.C.

(57) ABSTRACT

An image pickup apparatus includes an optical device, a transparent conductive film, an electrode pad, and a penetrating electrode. In the optical device, an optical element area for receiving light is formed on a first surface side of a substrate, and an external connection terminal is formed on a side of a second surface opposite to the first surface of the substrate. The transparent conductive film is formed to face the first surface of the substrate. The electrode pad is formed on the first surface of the substrate and configured to perform connection with a fixed potential. The penetrating electrode is connected to the electrode pad and formed to penetrate the substrate between the first surface and second surface. The transparent conductive film is connected to the electrode pad, and the penetrating electrode is connected to the external connection terminal on the side of the second surface of the substrate.

26 Claims, 8 Drawing Sheets

(56) References Cited

U.S. PATENT DOCUMENTS

2010/0321544 A1* 12/2010 Matsuo ............. H01L 21/76898
                                                         348/294
2011/0157445 A1*  6/2011 Itonaga ............. H01L 21/76898
                                                         348/308
2012/0075520 A1*  3/2012 Tecu ...................... G03B 17/12
                                                         348/345

* cited by examiner

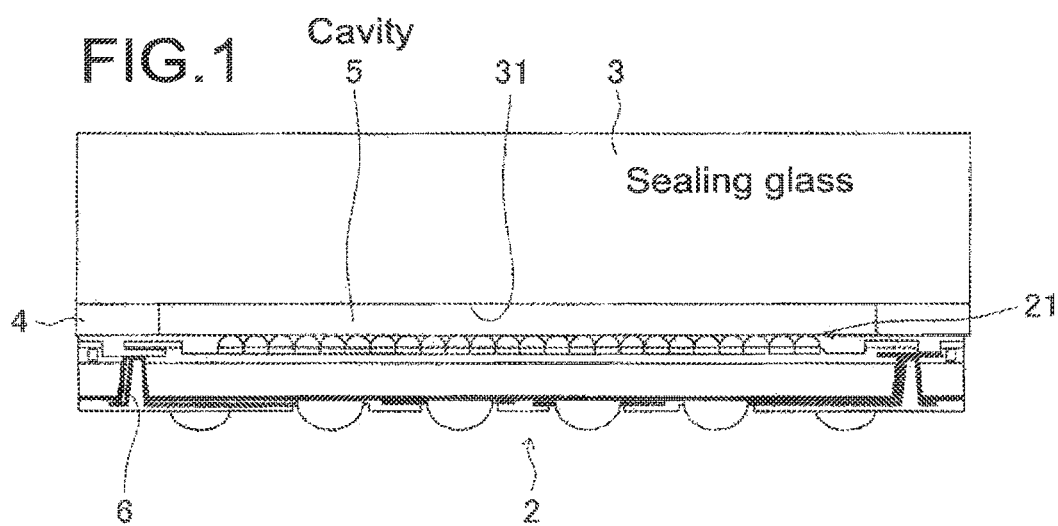
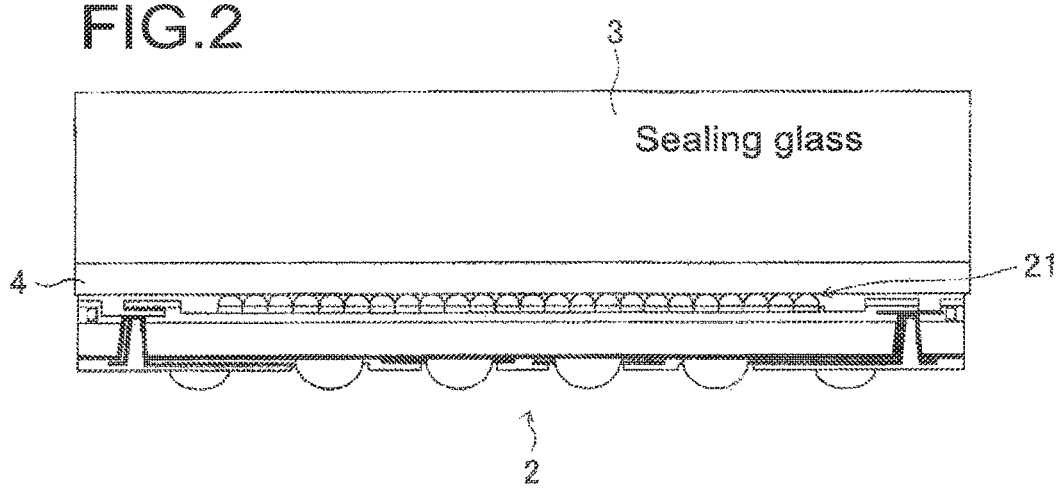

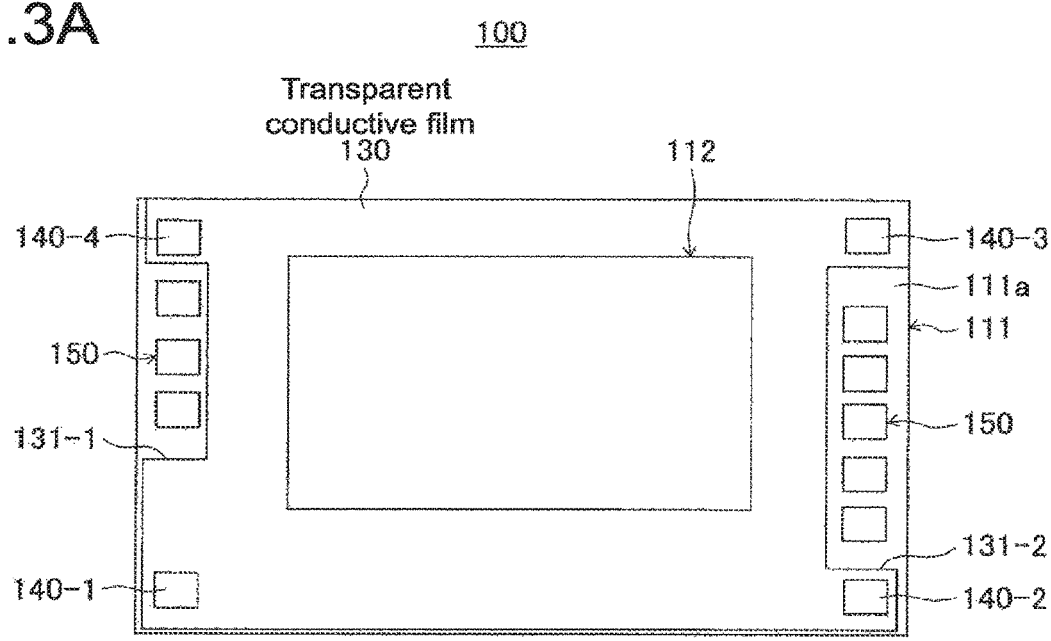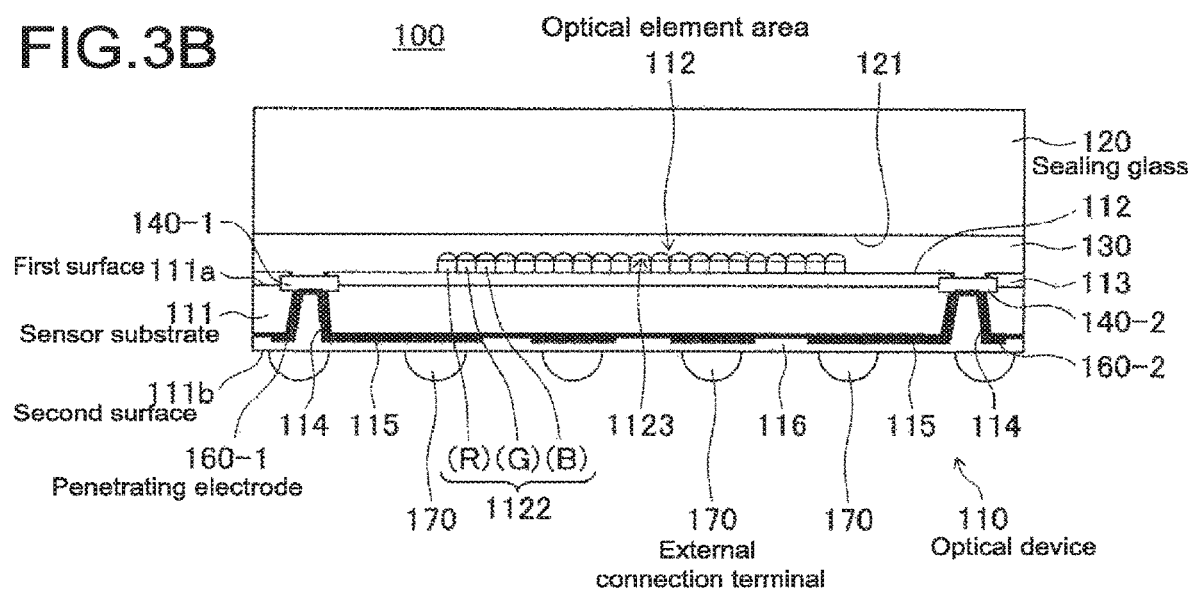

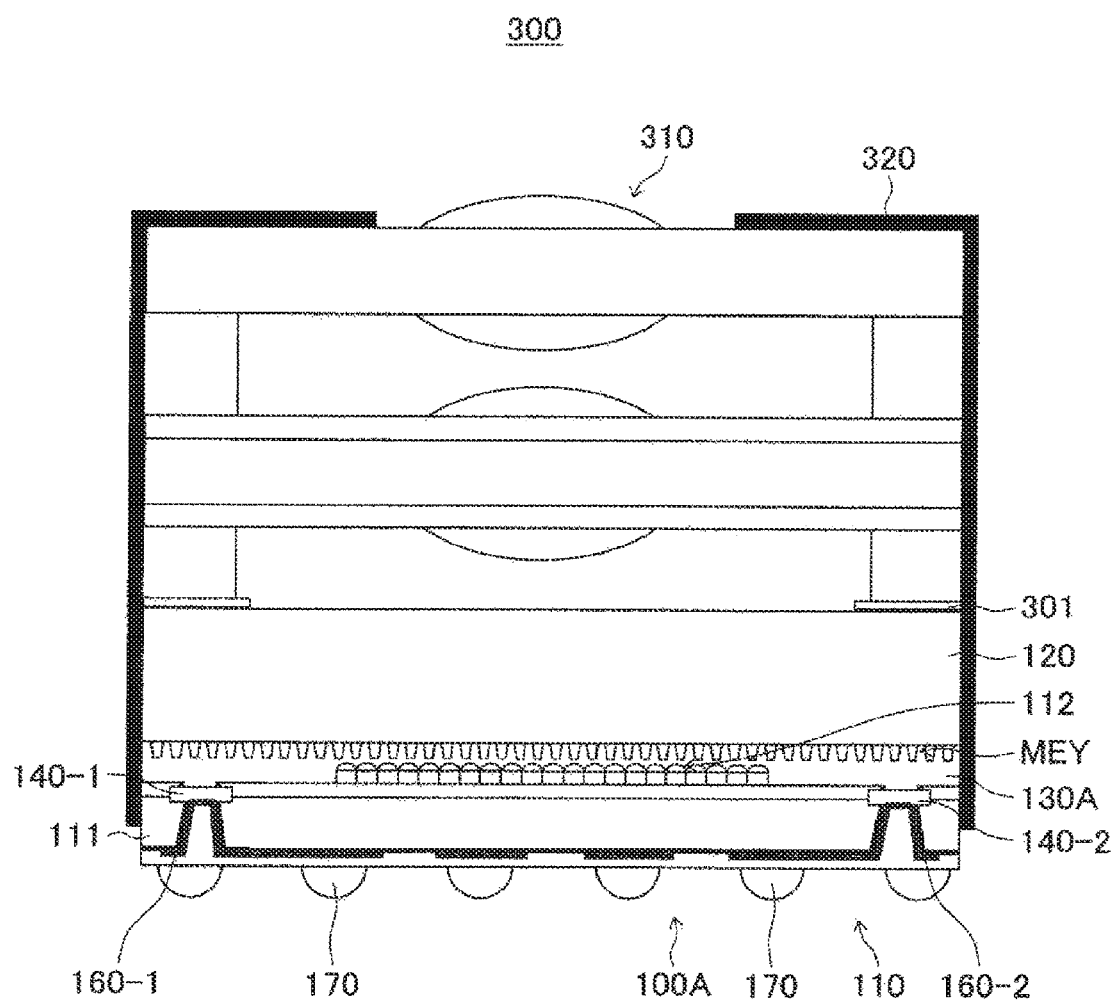

IMAGE PICKUP APPARATUS AND CAMERA MODULE

CROSS-REFERENCE TO RELATED APPLICATIONS

This application of a continuation of U.S. application Ser. No. 15/138,887, filed Apr. 26, 2016, which is a continuation of U.S. application Ser. No. 13/566,401, filed Aug. 3, 2012, now U.S. Pat. No. 9,343,597, which claims the benefit of priority under 35 U.S.C. § 119 of Japanese Application No. 2011-176125, filed Aug. 11, 2011, the entire disclosures of which are hereby incorporated herein by reference.

BACKGROUND

The present disclosure relates to an image pickup apparatus and a camera module in which an optical sensor such as a CCD (charge coupled device) and a CMOS (complementary metal oxide semiconductor) image sensor (CIS) is configured as a chip scale package.

As a simple package method for an optical sensor, a wafer chip scale package (WCSP) structure has been proposed.

FIG. 1 is a view showing a basic structure of a WCSP structure.

In a WCSP structure 1, disposed is a sealing glass (cover glass) 3 as a sealing material for protecting an upper portion of an optical element area 21 serving as a light receiving unit of a front surface of an optical device 2 serving as an optical sensor (sensor chip).

In the WCSP structure 1, the sealing glass 3 is disposed on a peripheral portion excluding the optical element area (light receiving unit) 21 of the optical device 2 with a resin 4 intervened. Therefore, in the WCSP structure 1, between the light receiving unit 21 of the optical device 2 and an opposed surface 31 of the sealing glass 3 with respect to the optical element area (light receiving unit) 21, a cavity 5 is formed.

In the CSP structure, an electrode 6 is formed with a through silicon via (TSV) that penetrates the sensor chip from the front surface to the back surface thereof, thereby eliminating wirings using wire bond, which makes it possible to bond the glass in a clean room in a wafer state.

As a result, it is possible to attain a size reduction, a cost reduction, and a dustless condition as compared to a COB (Chip On Board) type package of a past technique.

FIG. 2 is a view showing another structure of a WCSP structure.

A WCSP structure 1A shown in FIG. 2 is configured as a WCSP structure with no cavity because the cavity 5 in the WCSP structure 1 shown in FIG. 1 is filled with the resin 4.

In the following description, the WCSP structure with no cavity is referred to as a cavityless WCSP structure in some cases.

By employing the cavityless CSP structure with no cavity, a thermal stress generated in the cavity of the WCSP structure having a cavity can be significantly reduced, which can suppress an occurrence of warp.

Further, the cavityless CSP structure can suppress a reflection caused on an interface of the cavity (refractive index: 1) optically with the resin having the refractive index of approximately 1.5, with the result that it is possible to attain an increase of a light receiving quantity in the optical device 2.

Incidentally, in a lens-integrated camera module with a WCSP of a CCD or a CMOS image sensor, it is necessary to provide a function of an electromagnetic susceptibility (EMS) or an electromagnetic compatibility (EMC).

The EMS is a function for preventing a radiation electromagnetic field from another apparatus near the camera module and natural phenomena such as thunder and solar activity from inhibiting an operation of an electronic apparatus and for a protection from an external factor that causes a functional degradation of a system, a malfunction, and the like.

The EMC is a function for preventing the camera module itself from inhibiting an operation of another apparatus and preventing an electromagnetic interference (EMI) which may be an interference source at a certain level or more that affects a human body.

Image pickup apparatuses and camera modules which are equipped with the EMS or the EMC have been proposed (see, for example, Japanese Patent Application Laid-open Nos. 2010-283597, 2009-158863, and 2010-11230 (hereinafter, referred to as Patent Document 1, Patent Document 2, and Patent Document 3, respectively)).

The image pickup apparatus disclosed in Patent Document 1 includes a pixel area and has an image pickup element chip, in which a well is formed on a periphery thereof, and a metal shield which is disposed on the image pickup element chip and electrically connected with the well of the image pickup element chip.

In the camera module disclosed in Patent Document 2, around an optical device and shield glass, a light and electromagnetic shield is disposed.

The camera module disclosed in Patent Document 3 has a metal evaporation film that covers an entire side surface of the camera module.

SUMMARY

However, although the demand for a size reduction of an electronic apparatus is increased year by year, such a structure that a metal shield is attached to the outside of the camera module as disclosed in Patent Documents 1 and 2 makes the module large and makes a manufacturing process complicated, which increases a material cost.

Further, in the structure disclosed in Patent Document 3, the metal evaporation film that covers the lens-integrated camera module is electrically floated, which degrades the EMC effect.

In view of the above-mentioned circumstances, it is desirable to provide an image pickup apparatus and a camera module which can sufficiently exert the EMC or EMI effect while preventing the increase in size of the module, the complication of the process, and the increase in cost.

According to an embodiment of the present disclosure, there is provided an image pickup apparatus including an optical device in which an optical element area for receiving light is formed on a side of a first surface of a substrate, and an external connection terminal is formed on a side of a second surface opposite to the first surface of the substrate, a transparent conductive film formed to face the first surface of the substrate, an electrode pad formed on the first surface of the substrate and configured to perform connection with a fixed potential, and a penetrating electrode connected to the electrode pad and formed to penetrate the substrate between the first surface and second surface, in which the transparent conductive film is connected to the electrode pad, and the penetrating electrode is connected to the external connection terminal on the side of the second surface of the substrate.

According to another embodiment of the present disclosure, there is provided a camera module including an image pickup apparatus including an optical element area for receiving light, and a lens configured to form a subject image on the optical element area of the image pickup apparatus, in which the image pickup apparatus includes an optical device in which an optical element area for receiving light is formed on a side of a first surface of a substrate, and an external connection terminal is formed on a side of a second surface opposite to the first surface of the substrate, a transparent conductive film formed to face the first surface of the substrate, an electrode pad formed on the first surface of the substrate and configured to perform connection with a fixed potential, and a penetrating electrode connected to the electrode pad and formed to penetrate the substrate between the first surface and second surface, the transparent conductive film is connected to the electrode pad, and the penetrating electrode is connected to the external connection terminal on the side of the second surface of the substrate.

According to the embodiments of the present disclosure, it is possible to sufficiently exert an EMC or EMI effect while preventing an increase in size of the module, a complication of the process, and an increase in cost.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 1 is a view showing a basic structure of a WCSP structure;

FIG. 2 is a view showing the structure of a WCSP structure with no cavity;

FIGS. 3A and 3B are views each showing a first structural example of an image pickup apparatus according to a first embodiment;

FIG. 9 is a view showing a structural example of a camera module according to a sixth embodiment.

DETAILED DESCRIPTION OF EMBODIMENTS

Figure 4:
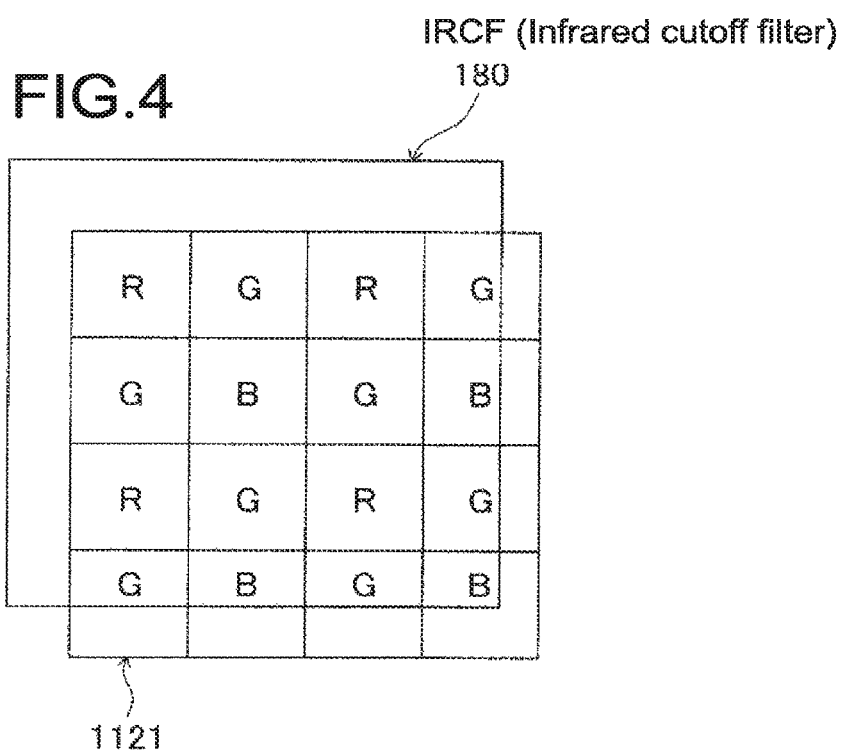
FIG. 4 is a view showing a structural example of a color filter according to the first embodiment.

Hereinafter, embodiments of the present disclosure will be described with reference to the drawings.

It should be noted that the description will be given in the following order.
1. First structural example of image pickup apparatus
2. Second structural example of image pickup apparatus
3. Third structural example of image pickup apparatus
4. Fourth structural example of image pickup apparatus
5. Fifth structural example of image pickup apparatus
6. Structural example of camera module

1. First Structural Example of Image Pickup Apparatus

FIGS. 3A and 3B are views each showing a first structural example of an image pickup apparatus according to a first embodiment.

FIG. 3A is a plan view showing the structural example in which a transparent conductive film is disposed on a first surface side of a substrate, and FIG. 3B is a schematic side view showing the entire structure of the image pickup apparatus.

In this embodiment, as an optical device (optical sensor), a CMOS image sensor (CIS) is applied as an example.

An image pickup apparatus 100 according to this embodiment basically has a WCSP structure which performs packaging with an optical sensor chip size.

The image pickup apparatus 100 is capable of employing either a cavity structure in which a cavity is formed between an optical element area (light receiving unit) of the optical device and an opposed surface of sealing glass with respect to the light receiving unit or a cavityless WCSP structure with no cavity.

In this embodiment, the first surface (front surface) means an incident side of image light of a subject, on which the light receiving unit of the optical device as the optical sensor of the image pickup apparatus is formed, and a second surface (back surface) means a side opposite to the first side. On the second surface, light is not incident, and a connection electrode such as a bump, an interposer, and the like are disposed.

The image pickup apparatus 100 has an optical device 110, a sealing material 120, a transparent conductive film 130 serving as an intermediate layer, electrode pads 140 (−1 to −4), another connection pad 150 serving as an external connection terminal, penetrating electrodes 160 (−1, −2), and an external connection terminal 170.

In this embodiment, the electrode pad 140 is a pad for a ground terminal for connecting to a fixed potential (ground potential in this example).

In this embodiment, as will be described later, the transparent conductive film 130 is connected to the electrode pad 140 and connected to the external connection terminal 170 through the penetrating electrode 160 connected to the electrode pad, and the external connection terminal 170 is connected to an external reference potential (ground potential).

With this structure, the transparent conductive film 130 also functions as a shield material in addition to the function of a protection film of the optical element area.

It should be noted that the transparent conductive film 130 and the sealing material 120 are formed of a transparent material with respect to light, which causes light to pass therethrough, and those materials each have a refractive index higher than the refractive index of air. For example, the sealing material 120 is formed of a material having a refractive index of approximately 1.5.

Further, in the structure shown in FIG. 3, the sealing material 120 is made of glass as an example, and the sealing material 120 refers to a sealing glass or a cover glass in some cases.

In the optical device 110, an optical element area 112 functioning as the light receiving unit is formed on the side of a first surface (front surface) 111a of a sensor substrate 111, and the external connection terminal 170 serving as an electrode for connection with the outside, such as a bump, is formed on the side of a second surface (back surface) 111b.

In the optical device 110, on a side portion (on the right and left side portions in FIG. 3) on the first surface 111a side of the sensor substrate 111, the electrode pads 140 (-1 to -4) and the connection pad 150 in addition thereto are formed.

In the optical device 110, in an area excluding a filter part of the optical element area 112 on the first surface 111a of the sensor substrate 111, an insulation film 113 is formed.

On the side of the first surface 111a of the sensor substrate 111, the electrode pads 140 are formed so as to be opened and exposed in such a manner that the electrode pads 140 are buried in the insulation film 113 to be electrically connected to the transparent conductive film 130.

The connection pad 150 serving as the external connection terminal formed on the first surface 111a of the sensor substrate 111 of the optical device 110 may be opened or may not be opened as a wire bonding pad. Further, the pad may not be a metal layer on an uppermost layer of stacked wirings in the optical device 110.

It should be noted that the "opened" refers to a directly connectable state in which the insulation film 113 is removed to expose the pad.

In the optical device 110, the penetrating electrodes 160 (-1, -2) are formed by through silicon vias (TSV) 114 that penetrate the sensor substrate 111 between the first surface 111a and the second surface 111b. With this structure, the wirings using the wire bonding are eliminated, and the glass can be bonded in a wafer state in a clean room.

The penetrating electrodes 160 (-1 to -4) are connected to the external connection terminal 170 connected to the external reference potential (ground potential) by a wiring 115 on the side of the second surface 111b of the sensor substrate 111.

The optical element area 112 serving as the light receiving unit is formed on the first surface 111a of the sensor substrate 111 and has a light receiving surface (pixel array unit) 1121 on which a plurality of pixels (light receiving elements) are arranged in a matrix pattern.

In the optical element area 112, on the front surface side of the pixel array unit 1121, a color filter 1122 is formed.

In the color filter 1122, color filters of three primary colors of R (red), G, (green), and B (blue) are formed in an array manner as on-chip color filters (OCCF) in the Bayer arrangement as shown in FIG. 4, for example. However, the arrangement pattern of the color filters is not limited to the Bayer arrangement.

It should be noted that, in the example of FIG. 4, an infrared cutoff filter (IRCF) 180 is formed so as to be overlapped with the color filter 1122.

In the optical element area 112, a micro lens array 1123 for collecting incident light to pixels is arranged on the front surface side of the color filter 1122.

In the optical element area 112, on the front surface side of the micro lens array 1123, an antireflection film or the like is formed, for example.

The transparent conductive film 130 is formed so as to fill a gap between the first surface 111a of the sensor substrate 111 on which the optical element area 112 having the structure mentioned above is formed and an opposed surface 121 of the sealing material (sealing glass) 120 with respect to the first surface 111a.

That is, the image pickup apparatus 100 according to the first embodiment is formed as so-called a cavityless structure.

It should be noted that the thickness of the transparent conductive film 130 is set to approximately 50 μm, for example. Further, the thickness of the sealing glass 120 is set to approximately 450 to 500 μm, for example.

The transparent conductive film 130 is formed of a transparent organic film or the like, in which conductive particles such as an ITO (Indium Tin Oxide) and ZnO2 (Zinc peroxide) are dispersed.

The transparent conductive film 130 is subjected to patterning into a shape as shown in FIG. 3A in the case where the connection pad 150 serving as the external connection terminal formed on the first surface 111a of the sensor substrate 111 of the optical device 110 is opened as the wire bonding pad.

That is, the transparent conductive film 130 is subjected to the patterning so as to have cutoff portions 131-1 and 131-2 obtained by removing parts of the transparent conductive film 130 so that the wire bonding pad is not electrically connected to (not brought into contact with) the transparent conductive film.

Further, in the first embodiment, the transparent conductive film 130 is formed so as to cover the optical element area 112, and a part thereof that is electrically connected with the optical device 110 and exerts an influence is formed so as to be non-contact electrically.

The insulation film 113 is formed in an area excluding the optical element area 112 in the first surface 111a of the sensor substrate 111 so as to be non-contact with the transparent conductive film 130 on the side of the optical device 110. Alternatively, the transparent conductive film 130 is subjected to the patterning so as to avoid the part that is electrically connected and exerts the influence in the optical device 110.

The image pickup apparatus 100 having the structure described above is manufactured basically as follows.

In the optical device 110, the transparent conductive film 130 is bonded with the glass 120 having the same size as the optical device 110 with an optically transparent adhesive at a wafer level.

After that, silicon on a second surface side, which is opposite to the first surface on which the optical element area 112 of the optical device 110 is formed, is cut away up to such a thickness that the penetrating electrode 160 can be formed.

Then, the through silicon via 114 for forming the penetrating electrode 160, which is connected with the external connection terminal 170 is formed, the insulation film 113 is formed, the re-wiring 115 is formed, and a protection film 116 is formed. Then, the matter thus obtained is divided into pieces of the size of each optical device 110, with the result that the WCSP of the optical device is completed.

In the image pickup apparatus 100 according to this embodiment, the transparent conductive film 130 is connected with the electrode pad 140 and is connected with the external connection terminal 170 through the penetrating electrode 160 connected to the electrode pad 140, and the external connection terminal 170 is connected with an external reference potential (ground potential).

With this structure, the transparent conductive film 130 functions as the shield material in addition to the function of the protection film of the optical element area, and the optical device 110 is covered with an EMC (Electro-Magnetic Compatibility) shield.

2. Second Structural Example of Image Pickup Apparatus

Figure 5A:
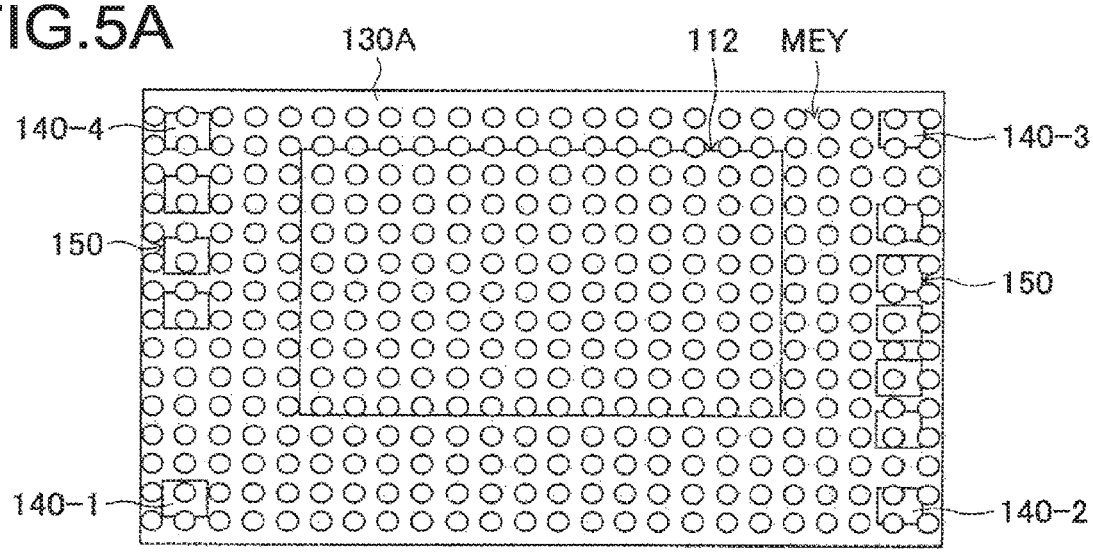
FIGS. 5A and 5B are views each showing a second structural example of an image pickup apparatus according to a second embodiment.
Figure 5B:
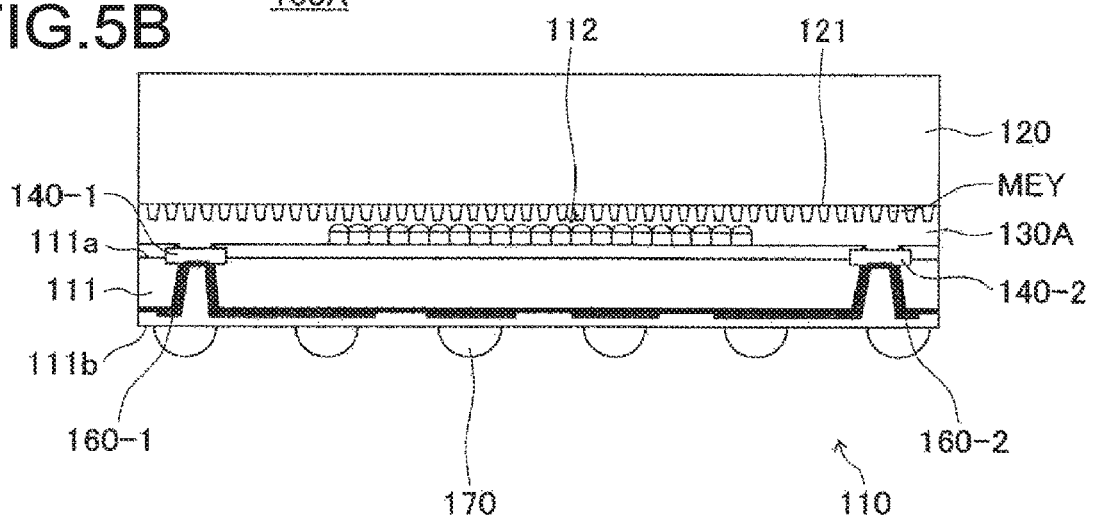

FIGS. 5A and 5B are views each showing a second structural example of an image pickup apparatus according to a second embodiment.

FIG. 5A is a plan view showing a structural example in which a transparent conductive film is disposed on a first surface side of a substrate, and FIG. 5B is a schematic side view showing an entire structure of the image pickup apparatus.

An image pickup apparatus 100A according to the second embodiment is different from the image pickup apparatus 100 according to the first embodiment in the following points.

In the image pickup apparatus 100A according to the second embodiment, a transparent conductive film 130A is formed so as to have a moth eye structure (MEY) showing optical characteristics by a fine structure pattern having a regular unevenness of a sub-micron order (e.g., 100 μm to 500 μm).

The reason why the moth eye structure is used for the transparent conductive film 130A is described as follows.

An ITO or ZnO2 used as a general transparent conductive film has a high refractive index of 1.9 to 2.0, so when such a transparent conductive film is formed with a flat structure, a large reflection is caused, which may degrade the optical characteristics.

In view of this, in the second embodiment, in order to avoid increasing the reflection and degrading the optical characteristics, the moth eye structure is employed.

Further, at this time, it is desirable that the refractive index of an optical element material is as high as possible, and the refractive index of 1.6 or more is necessary.

The moth eye structure is formed in a photoresist process by dry etching or wet etching.

The optical device having the moth eye structure formed is bonded with the sealing glass 120 with a transparent adhesive 190 with less optical characteristic degradation. As a result, a WCSP having a cavityless structure is formed.

Also in the image pickup apparatus 100A according to the second embodiment, the electrode pad 140 serving as a ground terminal on the optical device 110 is opened and is in contact with the transparent conductive film 130A to be electrically connected therewith. The connection pad 150 serving as another external connection terminal is not opened and is therefore not be electrically connected with the transparent conductive film 130A.

As described above, in the second embodiment, the transparent conductive film 130A is formed on a sensor surface with the moth eye structure.

The transparent conductive film 130A is connected with the electrode pad 140 and is connected with the external connection terminal 170 through the penetrating electrode 160 connected to the electrode pad 140, and the external connection terminal 170 is connected with an external reference potential (ground potential).

As a result, the transparent conductive film 130A functions as the shield material, in addition to the function as the protection film of the optical element area, and the optical device 110 is covered with the EMC shield.

Other structures of the image pickup apparatus 100A are the same as the image pickup apparatus 100.

3. Third Structural Example of Image Pickup Apparatus

Figure 6A:
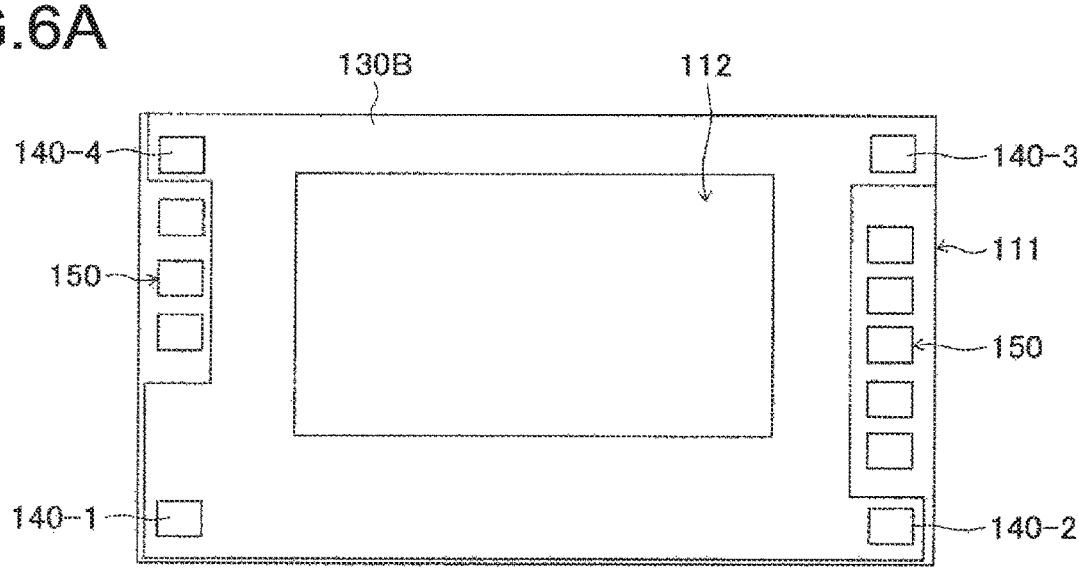
FIGS. 6A and 6B are views each showing a third structural example of an image pickup apparatus according to a third embodiment.
Figure 6B:
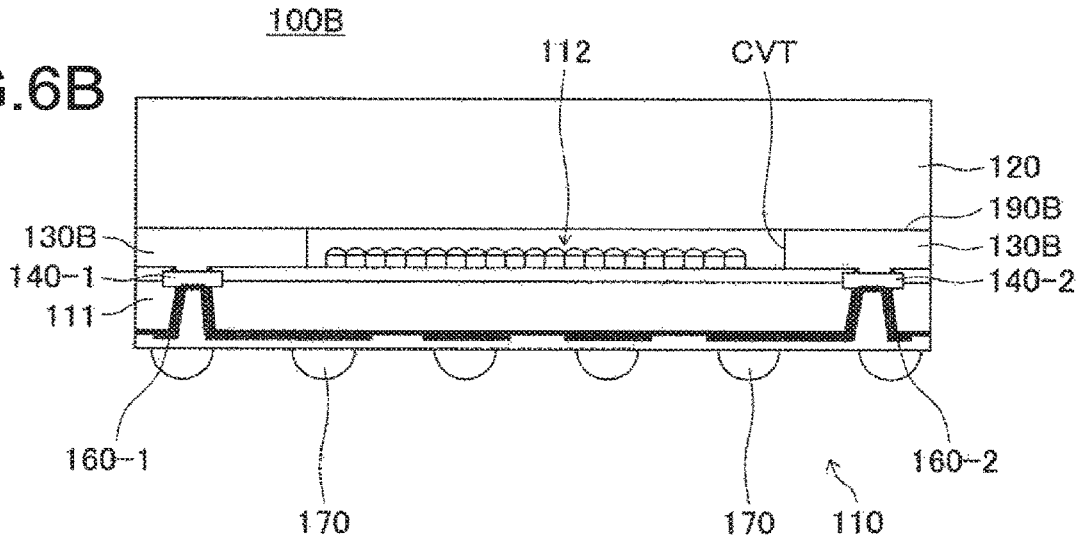

FIGS. 6A and 6B are views each showing a third structural example of an image pickup apparatus according to a third embodiment.

FIG. 6A is a plan view showing a structural example in which a transparent conductive film is disposed on a first surface side of a substrate, and FIG. 6B is a schematic side view showing an entire structure of the image pickup apparatus.

An image pickup apparatus 100B according to the third embodiment is different from the image pickup apparatus 100 according to the first embodiment in the following points.

In the image pickup apparatus 100B according to the third embodiment, in order to avoid degradation of the optical characteristics of the transparent conductive film, a transparent conductive film 130B is not formed on the optical element area 112, although the effect of the EMC shield is reduced.

With this structure, the image pickup apparatus 100B according to the third embodiment is structured as a cavity structure having an air layer (cavity) CVT which is disposed between the sealing glass 120 and the optical device 110.

In the image pickup apparatus 100B, on the transparent conductive film 130B formed outside the optical element area 112, an adhesive 190B (material which does not have to take the degradation of the optical characteristics into consideration) is applied and is bonded with the sealing glass 120.

Alternatively, with an adhesive which is pattern-formed on the sealing glass 120 into an area shape thereof, the transparent conductive film is bonded with the sealing glass 120.

Other structures of the image pickup apparatus 100B are the same as the image pickup apparatus 100.

4. Fourth Structural Example of Image Pickup Apparatus

Figure 7A:
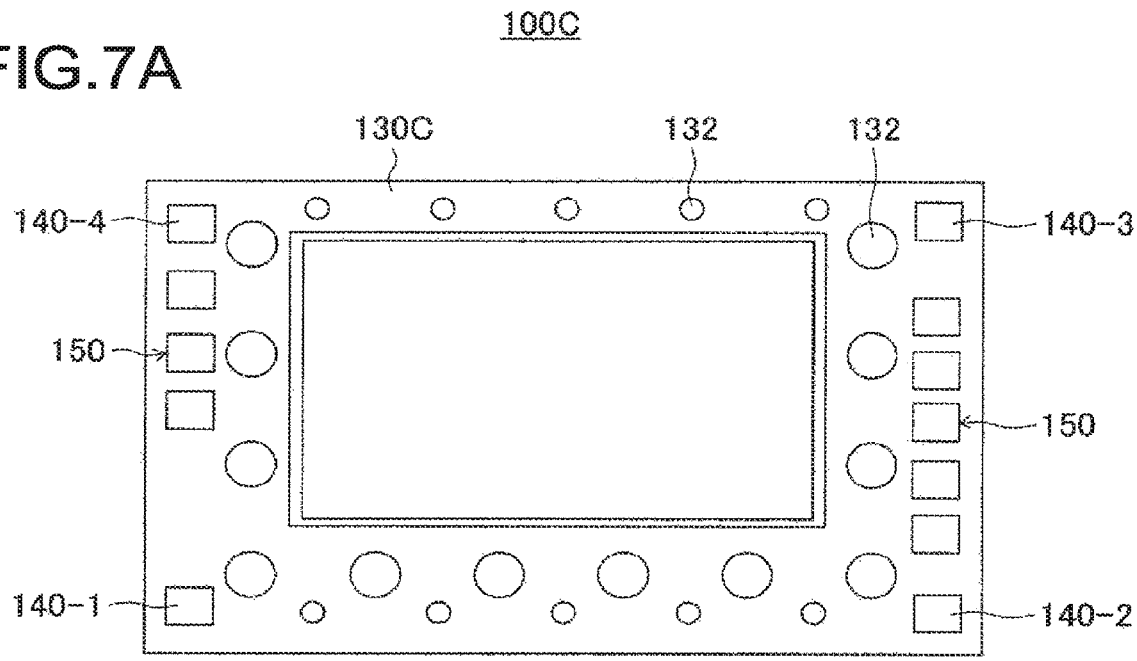
FIGS. 7A and 7B are views each showing a fourth structural example of an image pickup apparatus according to a fourth embodiment.
Figure 7B:
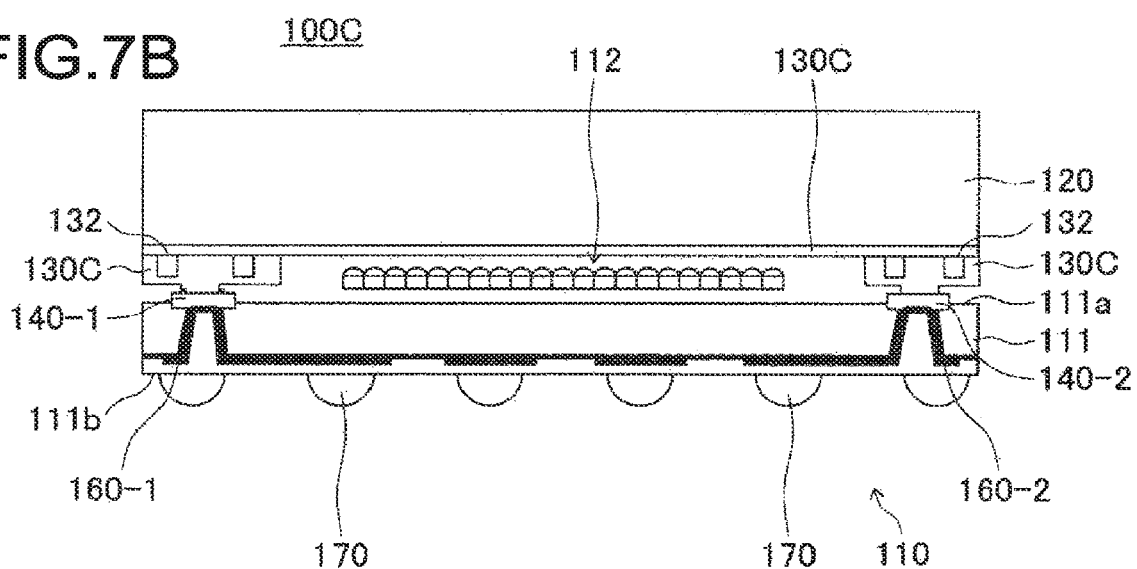

FIGS. 7A and 7B are views each showing a fourth structural example of an image pickup apparatus according to this embodiment.

FIG. 7A is a plan view showing a structural example in which a transparent conductive film is disposed on a first surface side of a substrate, and FIG. 7B is a schematic side view showing an entire structure of the image pickup apparatus.

An image pickup apparatus 100C according to a fourth embodiment is different from the image pickup apparatus 100B according to the third embodiment in the following points.

In the image pickup apparatus 100C according to the fourth embodiment, a large number of holes 132 are formed to increase a surface area of a transparent conductive film 130C.

In the case where the shield effect of the transparent conductive film is insufficient, by increasing the surface area (in particular, in a depth direction), it is possible to enhance the shield effect (see, Design technique for EMC, Part 4: shield, http://homepage3.nifty.com/tsato/dtemc/part4.html).

For this reason, in the fourth embodiment, the structure in which the transparent conductive film 130C has arbitrary holes 132 is employed.

Further, surrounding the optical device 110 by the transparent conductive film is effective for the EMC measure. Therefore, in the fourth embodiment, the transparent conductive film 130C is formed on an opposed surface 121 (side surface of the optical device) of the sealing glass 120.

It is desirable that the transparent conductive film 130C is extremely close to a transmittance of 100% and the refractive index of approximately 1.5 of the glass.

As described above, in the fourth embodiment, in order to increase the surface area of the transparent conductive film 130C, the large number of holes 132 are formed. By the penetrating electrode 160 and the electrode pad 140 serving as a ground terminal of the optical device 110 and the transparent conductive film 130C, the connection to an external ground terminal is carried out.

As a result, the transparent conductive film 130C functions as the shield material, in addition to the function as the protection film of the optical element area, and the optical device 110 is covered with the EMC shield.

5. Fifth Structural Example of Image Pickup Apparatus

Figure 8A:
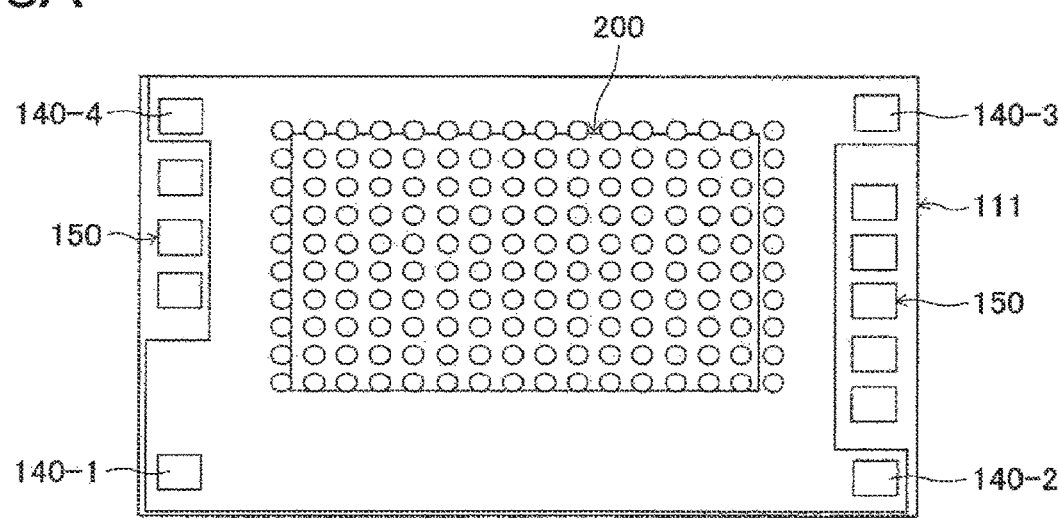
FIGS. 8A and 8B are views each showing a fifth structural example of an image pickup apparatus according to a fifth embodiment.
Figure 8B:
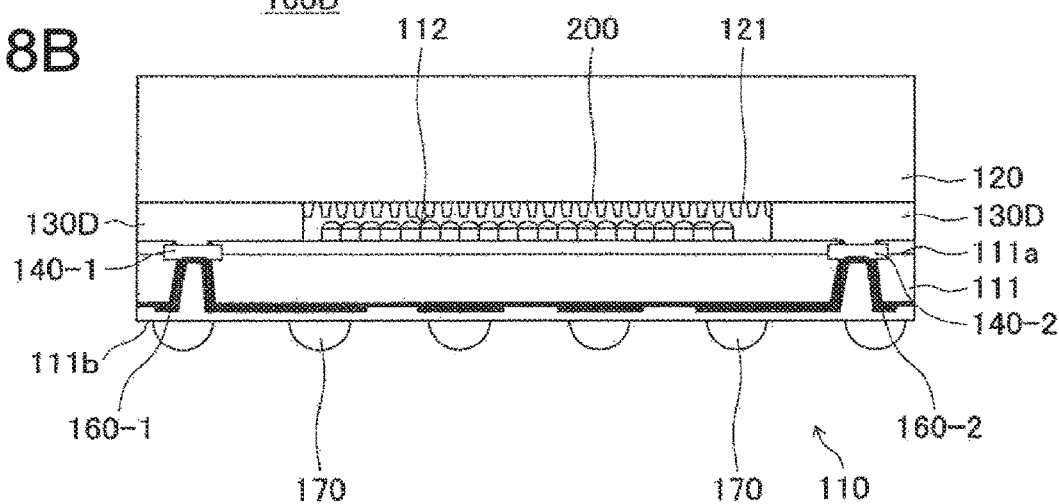

FIGS. 8A and 8B are views each showing a fifth structural example of an image pickup apparatus according to this embodiment.

FIG. 8A is a plan view showing a structural example in which a transparent conductive film is disposed on a first surface side of a substrate, and FIG. 8B is a schematic side view showing an entire structure of the image pickup apparatus.

An image pickup apparatus 100D according to a fifth embodiment is different from the image pickup apparatus 100A according to the second embodiment in the following points.

In the second embodiment, the transparent conductive film 130A has the moth eye structure.

In contrast, in the fifth embodiment, a cavityless WCSP using a transparent film 200 with a moth eye structure having no conductivity is achieved.

As described above, in the fifth embodiment, the transparent film 200 is formed on a sensor surface with the moth eye structure.

Then, the transparent conductive film 130D is connected with the electrode pad 140 and is connected with the external connection terminal 170 through the penetrating electrode 160 connected to the electrode pad 140, and the external connection terminal 170 is connected to an external reference potential (ground potential).

With this structure, the transparent conductive film 130D functions as the shield material in addition to the function as the protection film of the optical element area, and the optical device 110 is covered with the EMC shield.

Other structures of the image pickup apparatus 100D are the same as the image pickup apparatus 100A.

According to the embodiments, the following effects can be obtained.

The WCSP which has been subjected to the EMC measure can be provided.

By providing the WCSP which has been subjected to the EMC measure, a small, low-cost lens-integrated camera module can be provided.

By providing the cavityless WCSP, it is possible to attain a reduction in warp in a cavity area due to a reduction in thickness of the silicon, an increase in intensity of the cavity area, and a reduction in peeling of a spacer due to an increase in internal pressure of the cavity area at the time of reflow.

There is no limitation of a shield film material of the lens-integrated camera module, and a conductive or insulating material can be used.

Although an EMC resistance depends on the thickness of the conductive film, it is possible to adjust the EMC resistance in the WCSP by performing control with the shape of the transparent conductive film.

Because the penetrating electrode allows the shield (transparent conductive film) to be connected with the external ground, it is unnecessary to consider a connection method between the external connection terminal on the lower surface and the conductive film formed on the side surface.

It is possible to apply the image pickup apparatuses 100 and 100A to 100D described above to a camera module having an image pickup lens.

6. Structural Example of Camera Module

FIG. 9 is a view showing a structural example of a camera module according to this embodiment.

FIG. 9 shows a structural example of a lens-integrated camera module in the case where the EMC measure is sufficiently conducted in the WCSP structure. As an image pickup apparatus, the image pickup apparatus 100A according to the second embodiment is used as an example, but the image pickup apparatus 100, 100B, 100C, or 100D according to another embodiment can be applied thereto.

On the WCSP, an image pickup lens 310 is mounted on an adhesive 301, and a light shielding film 320 is applied to a side surface.

In a camera module 300, the image pickup lens 310 which forms a subject image on the optical element area (light receiving unit) 112 of the optical device (sensor) 110 is disposed on a front surface side (subject side) of the image pickup apparatus 100A.

The camera module 300 has a signal processing unit (not shown) or the like in addition to the image pickup lens 310.

In the camera module 300 having the above structure, an optical process is performed in the light receiving unit so that light from the subject taken by the image pickup lens 310 is easily converted into an electrical signal in the image pickup apparatus. After that, the light is guided to a photoelectric conversion unit of the optical device (sensor) 110, and the photoelectric conversion is performed to obtain the electrical signal. Then, in a signal processing unit in a subsequent stage, a predetermined signal process is performed with respect to the electrical signal obtained.

In the camera module according to this embodiment, it is also possible to sufficiently exert the EMC or EMI effect while preventing an increase in size of the module, a complication of the process, and an increase in cost.

It should be noted that the present disclosure can take the following configurations.

(1) An image pickup apparatus, including:
an optical device in which an optical element area for receiving light is formed on a side of a first surface of a substrate, and an external connection terminal is formed on a side of a second surface opposite to the first surface of the substrate;
a transparent conductive film formed to face the first surface of the substrate;
an electrode pad formed on the first surface of the substrate and configured to perform connection with a fixed potential; and
a penetrating electrode connected to the electrode pad and formed to penetrate the substrate between the first surface and second surface, in which
the transparent conductive film is connected to the electrode pad, and
the penetrating electrode is connected to the external connection terminal on the side of the second surface of the substrate.

(2) The image pickup apparatus according to Item (1), in which the transparent conductive film is formed as a moth eye structure so that at least an area opposed to the optical element area shows optical characteristics with a fine pattern.

(3) The image pickup apparatus according to Item (1), in which
in at least the area opposed to the optical element area, a transparent film formed as a moth eye structure that shows optical characteristics with a fine pattern is disposed.

(4) The image pickup apparatus according to any one of Items (1) to (3), in which
in at least a part of the transparent conductive film, a hole is formed in a depth direction.

(5) The image pickup apparatus according to any one of Items (1) to (4), further including
a sealing material configured to protect a side of the optical element area of the optical device, in which
the transparent conductive film is formed to fill a gap between the first surface of the substrate including the optical element area and a surface of the sealing material which is opposed to the first surface.

(6) The image pickup apparatus according to any one of Items (1) to (4), in which
the transparent conductive film is formed in a non-contact state with the optical element area.

(7) The image pickup apparatus according to Item (6), further including
a sealing material configured to protect a side of the optical element area of the optical device, in which
the transparent conductive film is formed on a surface of the sealing material, which is opposed to the optical element area, across at least the optical element area and a cavity.

(8) The image pickup apparatus according to Item (6), in which
the transparent conductive film is formed on an area excluding an area opposed to the optical element area.

(9) The image pickup apparatus according to any one of Items (1) to (8), in which
on the side of the first surface of the substrate, a pad different from the electrode pad is formed, and the different pad is in an electrically non-contact state with the transparent conductive film.

(10) A camera module, including:
an image pickup apparatus including an optical element area for receiving light; and
a lens configured to form a subject image on the optical element area of the image pickup apparatus, in which
the image pickup apparatus includes
an optical device in which an optical element area for receiving light is formed on a side of a first surface of a substrate, and an external connection terminal is formed on a side of a second surface opposite to the first surface of the substrate,
a transparent conductive film formed to face the first surface of the substrate,
an electrode pad formed on the first surface of the substrate and configured to perform connection with a fixed potential, and
a penetrating electrode connected to the electrode pad and formed to penetrate the substrate between the first surface and second surface,
the transparent conductive film is connected to the electrode pad, and
the penetrating electrode is connected to the external connection terminal on the side of the second surface of the substrate.

(11) The camera module according to Item (10), in which
the transparent conductive film is formed as a moth eye structure so that at least an area opposed to the optical element area shows optical characteristics with a fine pattern.

(12) The camera module according to Item (10), in which
in at least the area opposed to the optical element area, a transparent film formed as a moth eye structure that shows optical characteristics with a fine pattern is disposed.

(13) The camera module according to any one of Items (10) to (12), in which
in at least a part of the transparent conductive film, a hole is formed in a depth direction.

(14) The camera module according to any one of Items (10) to (13), further including
a sealing material configured to protect a side of the optical element area of the optical device, in which
the transparent conductive film is formed to fill a gap between the first surface of the substrate including the optical element area and a surface of the sealing material which is opposed to the first surface.

(15) The camera module according to any one of Items (10) to (13), in which
the transparent conductive film is formed in a non-contact state with the optical element area.

(16) The camera module according to Item (15), further including
a sealing material configured to protect a side of the optical element area of the optical device, in which
the transparent conductive film is formed on a surface of the sealing material, which is opposed to the optical element area, across at least the optical element area and a cavity.

(17) The camera module according to Item (15), in which
the transparent conductive film is formed on an area excluding an area opposed to the optical element area.

It should be understood by those skilled in the art that various modifications, combinations, sub-combinations and alterations may occur depending on design requirements and other factors insofar as they are within the scope of the appended claims or the equivalents thereof.

What is claimed is:
1. An image pickup apparatus, comprising:
a substrate having a front side that includes an optical element area and a back side, wherein the front side is configured to receive light and the back side is opposite to the front side;
a first electrode pad adjacent to the optical element area;
a sealing material above the optical element area, wherein the sealing material covers the first electrode pad;
an organic layer between the first electrode pad and the sealing material;
a second electrode pad on the substrate, wherein the organic layer is not between the second electrode pad and the sealing material; and
an electrode electrically connected to the first electrode pad,
wherein the first electrode pad is electrically connected to an external connection terminal via the electrode.
2. The image pickup apparatus according to claim 1, wherein the organic layer is a moth eye structure, and wherein at least an area of the organic layer opposed to the optical element area has a fine pattern.

3. The image pickup apparatus according to claim 1, wherein at least an area of the organic layer opposed to the optical element area comprises a transparent film having a moth eye structure with a fine pattern.

4. The image pickup apparatus according to claim 1, wherein the organic layer comprises at least one region that has a cut-out region, in a depth direction.

5. The image pickup apparatus according to claim 1, wherein the sealing material is configured to protect the optical element area.

6. The image pickup apparatus according to claim 1, wherein the organic layer is arranged in a region excluding an area opposed to the optical element area.

7. The image pickup apparatus according to claim 1, wherein the second electrode pad is indirectly connected to the organic layer.

8. The image pickup apparatus according to claim 1, wherein the first electrode pad is configured to connect to a fixed potential.

9. The image pickup apparatus according to claim 1, wherein the sealing material is a glass.

10. The image pickup apparatus according to claim 1, wherein the electrode electrically connected to the first electrode pad is a through silicon via (TSV) connection.

11. The image pickup apparatus according to claim 1, wherein the first electrode pad is on the front side of the substrate.

12. The image pickup apparatus according to claim 1, wherein the organic layer is in contact with the optical element area.

13. The image pickup apparatus according to claim 12, wherein the sealing material is configured to protect the optical element area of an optical device, wherein the organic layer is arranged on a surface of the sealing material, which is opposed to the optical element area.

14. A camera module, comprising:
at least one lens configured to form a subject image on an optical element area, and
an image pickup apparatus, comprising:
  a substrate having a front side that includes the optical element area and a back side, wherein the front side is configured to receive light and the back side is opposite to the front side;
  a first electrode pad adjacent to the optical element area;
  a sealing material above the front side of the optical device, wherein the sealing material covers the first electrode pad;
  an organic layer between the front side of the optical device and the sealing material;
  a second electrode pad on the substrate, wherein the organic layer is not between the second electrode pad and the sealing material;
  an electrode electrically connected to the first electrode pad,
  wherein the first electrode pad is electrically connected to an external connection terminal via the electrode.

15. The camera module according to claim 14, wherein the organic layer is a moth eye structure, and wherein at least an area of the organic material opposed to the optical element area shows optical characteristics with a fine pattern.

16. The camera module according to claim 14, wherein at least an area of the organic layer opposed to the optical element area comprises a transparent film having a moth eye structure with a fine pattern.

17. The camera module according to claim 14, wherein the organic layer comprises at least one region that has a cut-out region in a depth direction.

18. The camera module according to claim 14, wherein the sealing material is configured to protect the optical element area.

19. The camera module according to claim 14, wherein the organic layer fills a gap between the sealing material and the optical element area.

20. The camera module according to claim 14, wherein the first electrode pad is on the front side of the substrate.

21. The camera module according to claim 14, further comprising a first lens stacked on the sealing material.

22. The camera module according to claim 21, wherein the first lens is connected to the sealing material by an adhesive.

23. The camera module according to claim 21, further comprising a second lens stacked on the first lens.

24. The camera module according to claim 23, further comprising a cover, wherein the cover covers the first lens, the second lens, and the sealing material.

25. The camera module according to claim 24, wherein the cover covers at least a part of the optical element area.

26. The camera module according to claim 25, wherein the image pickup apparatus is substantially cube shaped.

* * * * *